United States Patent
Miura et al.

(10) Patent No.: US 7,331,092 B2
(45) Date of Patent: Feb. 19, 2008

(54) METHOD AND MANUFACTURING SURFACE ACOUSTIC WAVE DEVICE

(75) Inventors: Michio Miura, Kawasaki (JP); Takashi Matsuda, Kawasaki (JP); Yoshio Satoh, Kawasaki (JP); Masanori Ueda, Yokohama (JP); Hideki Takagi, Tsukuba (JP)

(73) Assignees: Fujitsu Media Devices Limited, Yokohama (JP); Fujitsu Limited, Kawasaki (JP); National Institute of Advanced Industrial Science and Technology, Tokyo (JP)

( * ) Notice: Subject to any disclaimer, the term of this patent is extended or adjusted under 35 U.S.C. 154(b) by 484 days.

(21) Appl. No.: 10/806,148

(22) Filed: Mar. 23, 2004

(65) Prior Publication Data

US 2004/0226162 A1 Nov. 18, 2004

(30) Foreign Application Priority Data

May 14, 2003 (JP) ............... 2003-136511

(51) Int. Cl.
*H04R 17/10* (2006.01)

(52) U.S. Cl. ............... 29/25.35; 29/594; 29/830; 204/192.18; 310/313 R; 310/313 B; 310/322

(58) Field of Classification Search ........... 29/25.35, 29/594, 830; 310/313 R, 313 B, 321, 322; 204/192.18, 192.34; 422/94, 95
See application file for complete search history.

(56) References Cited

U.S. PATENT DOCUMENTS 4,775,814 A * 10/1988 Yuhara et al. .......... 310/313 R
5,626,728 A * 5/1997 Ramakrishnan et al. ............ 204/192.18
5,895,629 A * 4/1999 Russell et al. ............... 422/94
6,445,265 B1 9/2002 Wright

FOREIGN PATENT DOCUMENTS

| JP | 63-200607 | * | 8/1988 |
|----|-----------|---|--------|
| JP | 3101280 | | 4/1991 |
| JP | 6-326553 | | 11/1994 |
| JP | 9208399 | | 8/1997 |
| JP | 11-55070 | | 2/1999 |
| JP | 11055070 | | 2/1999 |
| JP | 11-340769 | | 12/1999 |
| JP | 2002-9584 A | | 1/2002 |

(Continued)

OTHER PUBLICATIONS

Hideki Takagi; Room-Temperature Bonding of Silicon Wafers by Means of the Surface Activation Method; *Report of Mechanical Engineering Laboratory* No. 189; Dec. 2000; pp. 76-84.

(Continued)

*Primary Examiner*—A. Dexter Tugbang
(74) *Attorney, Agent, or Firm*—Arent Fox, LLP

(57) ABSTRACT

A method of manufacturing a surface acoustic device that has a surface acoustic wave filter including comb-like electrodes, electrode pads, and wiring patterns formed on a joined substrate produced by joining a piezoelectric substrate and a supporting substrate to each other. This method includes the steps of: activating at least one of the joining surfaces of the piezoelectric substrate and the supporting substrate; and joining the piezoelectric substrate and the supporting substrate in such a manner that the activated joining surfaces face each other.

3 Claims, 14 Drawing Sheets

FOREIGN PATENT DOCUMENTS

| JP | 2002-16468 A | 1/2002 |
|----|----|----|
| JP | 2002-184960 A1 | 6/2002 |
| JP | 2002-534886 A | 10/2002 |
| JP | 2003-68744 A1 | 3/2003 |
| JP | 2003-124767 A | 4/2003 |

OTHER PUBLICATIONS

Takagi, "Room-Temperature Bonding of Silicon Wafers by Means of the Surface Activation Method", Report of Mechanical Engineering Laboratory, No. 189, pp. 69-75 (Dec. 2000).

Matsunami et al., "Semiconductor Material and Devices", Foundation of Modern Technology, vol. 10, Iwanami Syoten (Jul. 30, 2001).

"Spontaneous Bonding?—World of Room Temperature Bonding", Gendai Kagaku, pp. 31-38 (Jul. 1998).

Takagil et al., "Room-temperature Wafer Bonding of Si to $LiNbO_3$, $LiTaO_3$, $Gd_3Ga_5O_{12}$ by Ar-Beam Surface Activation", Journal of Micromech and Microengineering, vol. 11, No. 4, pp. 348-352 (2001).

Takagi et al., Room-Temperature Bonding of Si Wafers to Pt Films on $SiO_2$ or $LiNbO_3$ Substrates Using Ar-Beam Surface Activation, Japanese Journal of Applied Physics, vol. 38, pp. L1559-L1561, Part 2, No. 12B (1999).

"SAW Properties of $SiO_2$/128° $Y$-$X$ $LiNbO_3$ Structure Fabricated by Magnetron Sputtering Technique," Kazuhiko Yamanouchi et al., IEEE Transactions on Sonics and Ultrasonics, vol. SU-31, No. 1, Jan. 1984, pp. 51-57.

"Temperature Stable SAW Devices Using Directly Bonded $LiTaO_3$/Glass Substrates," H. Sato et al., 1998 IEEE Ultrasonics Symposium, pp. 335-338.

"Theoretical Analysis of SAW Propagation Characteristics under the Strained Medium and Applications for High Temperature Stable High Coupling SAW Substrates," K. Yamanouchi et al., 1999 IEEE Ultrasonics Symposium, pp. 239-242, p. 51-52 of reference in Japanese.

\* cited by examiner

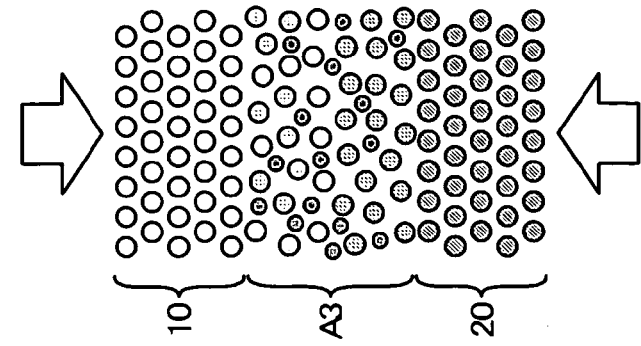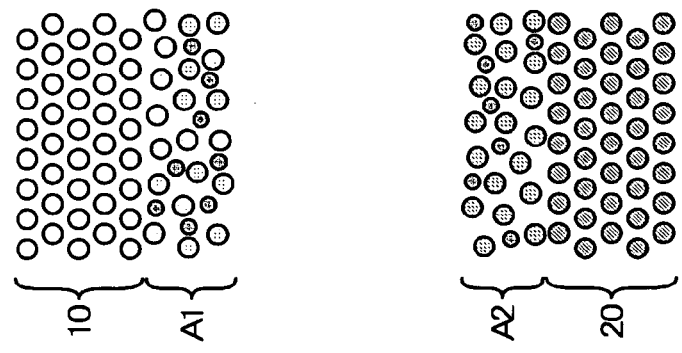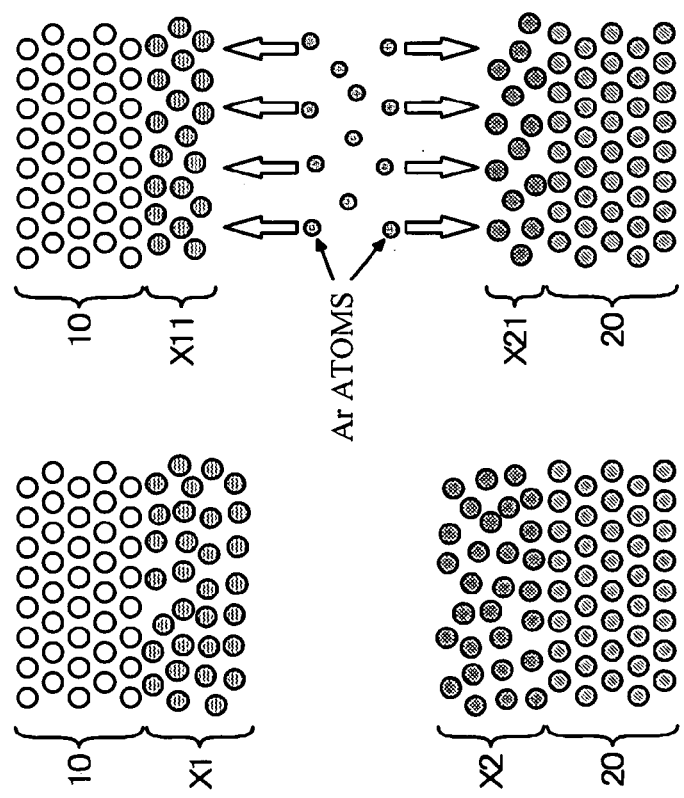

METHOD AND MANUFACTURING SURFACE ACOUSTIC WAVE DEVICE

BACKGROUND OF THE INVENTION

1. Field of the Invention

The present invention generally relates to a surface acoustic wave device and a method of manufacturing the surface acoustic wave device, and more particularly, to a method of manufacturing a surface acoustic wave device that includes a joined substrate.

2. Description of the Related Art

Surface acoustic wave (hereinafter referred to simply as SAW) devices are being widely used today as bandpass filters in communication devices such as portable telephones. In this trend, there has been an increasing demand for SAW filters with higher performances, as portable telephones has been becoming more and more sophisticated.

SAW devices, however, have a problem of passbands that shift with temperature. To solve this problem and develop SAW devices having excellent stability with temperature has been a target to achieve in this field of technology in recent years.

Materials for SAW devices are piezoelectric materials such as lithium tantalate (hereinafter referred to simply as LT), lithium niobate (hereinafter referred to simply as LN), and crystal. Among these materials, LT and LN, which are being widely used today, have large electromechanical coupling coefficients that are advantageous in achieving broadband filter characteristics. However, these materials have a drawback of having poor stability with temperature.

On the other hand, crystal is a piezoelectric material that has excellent stability with temperature, but has a drawback of having a small electromechanical coupling coefficient.

So as to improve the above characteristics and obtain a piezoelectric material with a large electromechanical coupling coefficient and excellent stability with temperature, various methods have been suggested. Yamanouchi, et al., for example, suggest a substrate produced by forming a silicon oxide film having an opposite temperature coefficient on the surface of an LN or LT substrate ("IEEE Trans. on Sonics and Ultrasonics", vol. SU-31, pp. 51-57, 1984, hereinafter referred to as "Non-Patent Document 1"). Nakamura, et al. suggest a method of improving the stability with temperature changes by utilizing the field short-circuiting effect of a polarization inversion layer that is thinner than the SAW wavelength formed on the surface of a LT substrate (Japanese Patent Publication No. 2516817, hereinafter referred to as "Patent Document 1"). Onishi, et al. suggest a method of increasing the stability with temperature by joining a thin piezoelectric substrate and a thick low-thermal-expansion material substrate directly to each other so as to restrict expansion and contraction of the piezoelectric substrate with changes in temperature (Japanese Unexamined Patent Publication No. 11-55070, hereinafter referred to as "Patent Document 2", and "Proc. of IEEE Ultrasonics Symposium", pp. 335-338, 1998, hereinafter referred to as "Non-Patent Document 2"). Yamanouchi, et al. also suggest the same structure that is formed using an adhesive or the like ("Proc. of IEEE Ultrasonics Symposium", pp. 239-242, 1999, hereinafter referred to as "Non-Patent Document 3"). Further, Isokami suggests a method of improving SAW characteristics by joining two substrates of different types through a solid phase reaction (Japanese Unexamined Patent Publication No. 9-208399, hereinafter referred to as "Patent Document 3").

With the substrate produced by forming a silicon oxide on the surface of a LT or LN substrate disclosed in Non-Patent Document 1, however, it is difficult to maintain the film quality and thickness of the silicon oxide film at a certain level, and frequency fluctuations cannot be avoided in the SAW device. Furthermore, a silicon oxide film is also formed on comb-like electrodes (interdigital transducers, IDTs) in this conventional method. As a result, a SAW propagation loss becomes larger, and this method can be applied to only limited types of devices.

With the method of forming a polarization inversion layer disclosed in Patent Document 1, it is difficult to control the depth of the polarization inversion layer that greatly affects the characteristics of each SAW device.

With the methods of joining a low-thermal-expansion material substrate to a piezoelectric substrate disclosed in Patent Document 2 and Non-Patent Document 2, it is necessary to employ a low-thermal-expansion material substrate having a low Young's modulus such as glass, so that the wafer does not break during a high-temperature annealing process for joining substrates that have been cleaned. As a result, distortion caused by the difference between the thermal expansion coefficients of the two joined substrates does not sufficiently reach the piezoelectric substrate, and the temperature characteristics are not improved adequately.

With the method of joining a piezoelectric substrate and a low-thermal-expansion material at ordinary temperatures using an ultraviolet curing adhesive disclosed in Non-Patent Document 3, stress is eased by the adhesive at the interface, and the effect of improving the temperature characteristics is reduced accordingly.

With the method of using a substrate formed by joining through a solid phase reaction disclosed in Patent Document 3, it is necessary to carry out a heating process at such a temperature that does not cause melting after the substrate joining process. However, as the heating is performed at a temperature higher than 1000° C., a change is caused in the constant of piezoelectric substrate. As a result, an acoustic velocity change and frequency fluctuations are caused.

SUMMARY OF THE INVENTION

It is therefore an object of the present invention to provide a method of manufacturing a surface acoustic wave device in which the above disadvantage is eliminated.

A more specific object of the present invention is to provide a method of manufacturing, through simple manufacturing processes, a surface acoustic wave device that includes a piezoelectric substrate with an excellent electromechanical coupling coefficient, and has better temperature coefficients of frequency.

The above objects of the present invention are achieved by a method of manufacturing a surface acoustic wave device that has a surface acoustic wave filter including comb-like electrodes, electrode pads, and wiring patterns formed on a joined substrate produced by joining a piezoelectric substrate and a supporting substrate to each other, the method comprising the steps of: activating at least one of the joining surfaces of the piezoelectric substrate and the supporting substrate; and joining the piezoelectric substrate and the supporting substrate in such a manner that the activated joining surfaces face each other. The activation process removes impurities on the surfaces of the substrates and cleans the joined surfaces, this enhancing the joining force exerted between the piezoelectric substrate and the supporting substrate. The process of joining two substrates after the surface activation process makes it possible to select substrate materials while putting much value on the temperature characteristic and tractability, and reliably results in surface acoustic wave elements having improved frequency-temperature characteristics. It is also possible to tightly join the two substrates without the anneal process performed at a temperature higher than 1000° C. and to thus prevent degradation of the constants of the piezoelectric substrate.

The above method may be configured so that the activating step includes the step of carrying out an activation process, using ion beams, neutralized high-energy atom beams, or plasma of inert gas or oxygen, on at least one of the joining surfaces of the piezoelectric substrate and the supporting substrate. Collision energy of the inert gas or oxygen atoms makes a layer including these components on the joined surfaces. The layer thus formed includes many lattice defects and is amorphous in many cases. If the interface is formed by metal, the layer may be crystallized.

The above method may be configured so that the activating step includes the step of carrying out an activation process by forming an intermediate film, in a vacuum, on at least one of the joining surfaces of the piezoelectric substrate and the supporting substrate. The intermediate film may be made of the same material as that of the piezoelectric substrate or the supporting substrate, or may be made of a material different from the materials of the two substrates. The film formed in the vacuum has a clean surface, which enhances the joining force. Before or after the intermediate film is grown, at least one of the two substrates may be subjected to the activation process with ion beams, neutralized high-energy atom beams, or plasma of inert gas or oxygen.

The above method may be configured so that the joining step includes the step of joining the piezoelectric substrate and the supporting substrate at room temperature or by heating these substrates at a temperature of 100° C. or lower. The heating process may further enhance the joining force.

The above method may be configured so as to further include the step of annealing the piezoelectric substrate and the supporting substrate at 200° C. or lower, the annealing step being carried out after the joining process. The annealing process as low as 200° C. or lower does not change the constants of the piezoelectric substrate and may enhance the joining force.

The above method may be configured so that the annealing step is carried out when the piezoelectric substrate is thinner than the supporting substrate. This configuration minimizes thermal stress and prevents the substrates from being destroyed during the annealing step.

The above method may be configured so as to further include the step of thinning the piezoelectric substrate joined in the joining step, or dividing the surface acoustic wave filter that includes the piezoelectric substrate and the supporting substrate joined in the joining step, so as to form each chip, wherein the annealing step is carried out after the thinning or dividing step. The thinning or dividing step contributes to minimizing thermal stress and prevents the substrates from being destroyed.

The above method may be configured so that the step of joining the piezoelectric substrate and the supporting substrate is carried out in a vacuum, in an atmosphere of a high purity gas, or in the air. Although the joining step carried out in the air may be used for limited materials in light of the joining strength, it is possible to use simple machines for joining and positioning and improve the throughput of the joining process.

The above method may be configured so that it further includes the step of exposing at least one of the joining surfaces of the piezoelectric substrate and the supporting substrate, which have been activated in the activating step, to water or vapor.

The above method may be configured so that the piezoelectric substrate is a lithium tantalate or lithium niobate piezoelectric single-crystal substrate that is a rotated Y-cut plate having a surface acoustic wave propagation direction X.

The above method may be configured so that the supporting substrate is a single-crystal substrate containing silicon or sapphire as a main component, or a ceramic substrate containing aluminum oxide, aluminum nitride, or silicon nitride as a main component. For example, sapphire has the small expansion coefficient and may easily be processed, as compared to the piezoelectric substrate. This holds true for silicon, silicon nitride, aluminum oxide, aluminum nitride. The use of these materials realizes easily producible surface acoustic wave devices having improved temperature characteristics.

The above method may be configured so that the supporting substrate has a resistivity as large as 100 Ω·cm or higher in an area immediately below the region in which the electrode pads and/or the wiring patterns are formed. This prevents electrical energy from flowing out to ground formed on the lower surface of the supporting substrate from the electrode pads or wiring patterns through the supporting substrate.

The above method may be configured so as to further include the step of forming an intermediate film that has a different main component from the main component of the piezoelectric substrate or the supporting substrate, the intermediate film being interposed between the piezoelectric substrate and the supporting substrate. This arrangement enhances the joining strength of the two substrates.

The above method may be configured so that the intermediate film contains silicon, silicon oxide, silicon nitride, or aluminum nitride as a main component, or is in the form of a conductive layer. In this case, the intermediate film may be divided into parts. Generally, when the intermediate film is formed by, for example, a conductor, an increased electrostatic capacitance develops between the comb-like electrodes, electrode pads and interconnection lines formed on the piezoelectric substrate and the ground pattern formed on the lower surface of the supporting substrate, and increases the electrical loss of the surface acoustic wave device. In contrast, the divided arrangement of the intermediate film decreases the total electrostatic capacitance and the electrical loss.

The intermediate film may be divided into parts each having a smaller length than the aperture length of the comb-like electrodes. This arrangement reduces the electrical loss that develops across the intermediate film.

The above method may be carried out so that the intermediate film is formed in a region that is not situated immediately below the region in which the electrodes pads and/or the wiring patterns are formed. This arrangement makes it possible to prevent leakage of electrical energy through a conductive film located at the joining interface.

The above supporting substrate may be an SOS substrate that has a silicon film formed on a sapphire substrate, or an SOI substrate that has an insulating film and a silicon film stacked on a silicon substrate.

BRIEF DESCRIPTION OF THE DRAWINGS

Other objects, features and advantages of the present invention will become more apparent from the following detailed description when read in conjunction with the accompanying drawings, in which:

FIGS. 2A through 2D illustrate the procedures of a substrate joining technique that is utilized in the first embodiment of the present invention;

DESCRIPTION OF THE PREFERRED EMBODIMENTS

The following is a description of preferred embodiments of the present invention, with reference to the accompanying drawings.

First Embodiment

Figure 1:
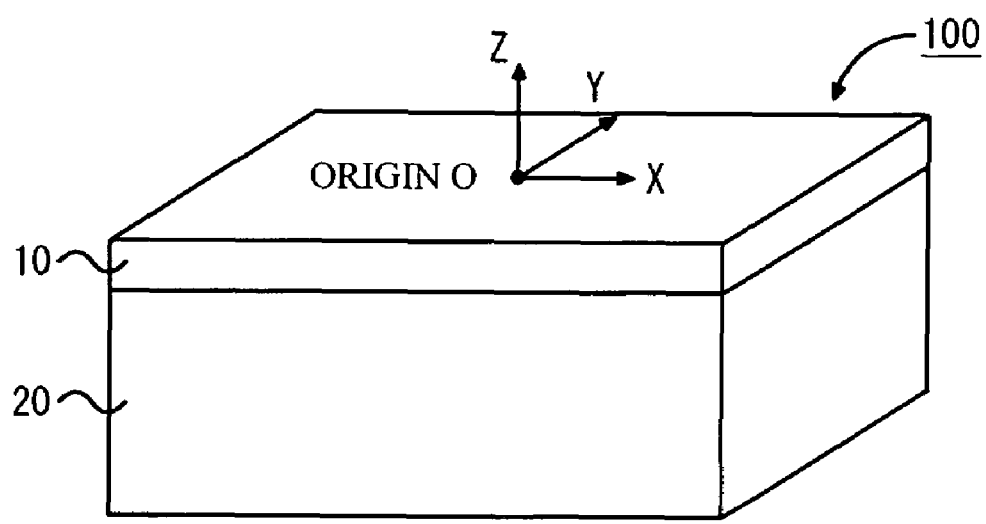
FIG. 1 is a perspective view of a joined substrate that is employed in a first embodiment of the present invention.

Referring to FIG. 1, a first embodiment of the present invention will be described. FIG. 1 is a schematic perspective view of a joined substrate 100 to be employed in a surface acoustic wave (SAW) device in accordance with this embodiment.

A piezoelectric substrate 10 is a piezoelectric single-crystal substrate of 42-degree Y-cut X-propagation lithium tantalate (hereinafter referred to as the "LT substrate"). The LT substrate has a SAW propagation direction X, and is a rotated Y-cut plate. In the LT substrate, the linear expansion coefficient in the SAW propagation direction X is 16.1 ppm/° C. A supporting substrate 20 is a R-cut sapphire single-crystal substrate (hereinafter referred to as the "sapphire substrate"), for example. The linear expansion coefficient in the SAW propagation direction X is 5.3 ppm/° C. The piezoelectric substrate 10 is 30 µm thick, and the supporting substrate 20 is 300 µm thick.

In this structure, the piezoelectric substrate 10 and the supporting substrate 20 are joined by a substrate joining method utilizing surface activation. Referring now to FIGS. 2A through 2D, the procedures of the substrate joining method employed in this embodiment will be described below.

As shown in FIG. 2A, both of the substrates 10 and 20 are cleaned through RCA cleaning or the like, so that impurities X1 and X2 including compounds and adsorbate that adhere to the surfaces, especially the joining surfaces, are removed (cleaning process). RCA cleaning is one of the techniques that utilize solutions such as a cleaning solution of ammonia, hydrogen peroxide, and water, mixed at a volume mixing ratio of 1:1-2:5-7, and a cleaning solution of hydrochloric acid, hydrogen peroxide, and water, mixed at a volume mixing ratio of 1:1-2:5-7.

After the cleaned substrates are dried (drying process), as shown in FIG. 2B, the joining surfaces of the substrates 10 and 20 are exposed to ion beams, neutralized high-energy atom beams, or plasma of inert gas such as argon (Ar) or oxygen, so that residual impurities X11 and X21 are removed, and that the surfaces can be activated (activation process). The particle beams or plasma to be used are selected according to the materials of the substrates to be joined. For example, an inert gas is effective in the activation process for most materials, but oxygen ion beams and plasma are also effective in the activation process for silicon oxide ($SiO_2$) or the like.

Through the activation process, amorphous layers A1 and A2 of several nanometers thickness containing atoms of the material used in the irradiation as the surface activation treatment are formed on the irradiated surfaces (the joining surfaces), as shown in FIG. 2C. The amorphous layer A1 formed on the side of the piezoelectric substrate 10 is made of the component atoms contained therein (which are atoms contained in LT in this embodiment) and atoms contained in the irradiation beams (which are Ar atoms in this embodiment). Likewise, the amorphous layer A2 formed on the side of the supporting substrate 20 is made of component atoms contained therein (which are atoms contained in sapphire in this embodiment) and atoms contained in the irradiation beams (which are Ar atoms in this embodiment).

The piezoelectric substrate 10 and the supporting substrate 20 having the amorphous layers A1 and A2 are then positioned and joined to each other (joining process), so that the joined substrate 100 that has an amorphous layer A3 between the substrates 10 and 20 is formed as shown in FIG. 2D. For most materials, this joining process is carried out in a vacuum or in an atmosphere of a high purity gas such as an inert gas, though it may be carried out in the air. Also, it might be necessary to press the substrates 10 and 20 from both sides. This joining process can be carried out at room temperature or by heating the substrates at a temperature of 100° C. or lower. The use of heating may increase the joining strength of the substrates 10 and 20.

The ion beams of an inert gas or the like are used in the above surface activation process, it is also possible to carry out a surface activation process by forming a film that serves as an intermediate film between the joining surfaces of the substrates in a vacuum. The surface of the film formed in a vacuum has an active state without contaminated matters, and therefore, the joining strength is increased. In that case, the material(s) of the film to be formed may be the same as the materials of the substrates 10 and 20, or may be different from the materials of the substrates 10 and 20, so as to increase the joining strength in the manner described later. Also, performing surface activation using ion beams of an inert gas before or after the film formation is also effective in an attempt to increase the joining strength.

In a case where $SiO_2$ or the like is employed as the material for the substrates or the intermediate film, the joining surfaces may be exposed to water or vapor in a pre-treatment prior to the joining process, so as to obtain a sufficiently high joining strength. In that case, both of the substrates need adequate drying after exposed to water or vapor.

As described above, in the substrate joining technique employed in this embodiment, it is not necessary to perform annealing at a temperature of 1000° C. or higher after the joining of the substrates 10 and 20. Accordingly, there is not a possibility of a substrate breaking, and the substrate joining process can be carried out on various kinds of substrates.

With some substrate materials, the joining strength can be increased through annealing at a temperature of 200° C. or lower after the joining process. However, this annealing process exhibits effects where the piezoelectric substrate 10 is thinner than the supporting substrate 20, where the piezoelectric substrate 10 has been processed so as to have a desired small thickness, or where the joined substrate 100 having a SAW resonator 30 (see FIG. 3) has been formed into a chip (a SAW device 110A shown in FIG. 3). In this manner, the generation of thermal stress can be minimized to the lowest possible level, and the substrates can be prevented from breaking. If a process of grinding and polishing the piezoelectric substrate 10 (grinding and polishing process) is carried out, the annealing process should come after this grinding and polishing process. In a case where the thickness of a LT substrate before the joining process is 250 μm while the thickness of a desired LT substrate (the piezoelectric substrate 10) to form the joined substrate 100 is 30 μm, for example, an 1-hour annealing process should be carried out at a temperature of 200° C., after the joined LT substrate is ground so as to reduce the thickness to 30 μm. The annealing process after thinning the piezoelectric substrate not only minimizes the generation of thermal stress but also increases the joining strength between the substrates 10 and 20. Thus, the substrates 10 and 20 can be prevented from breaking.

Figure 3:
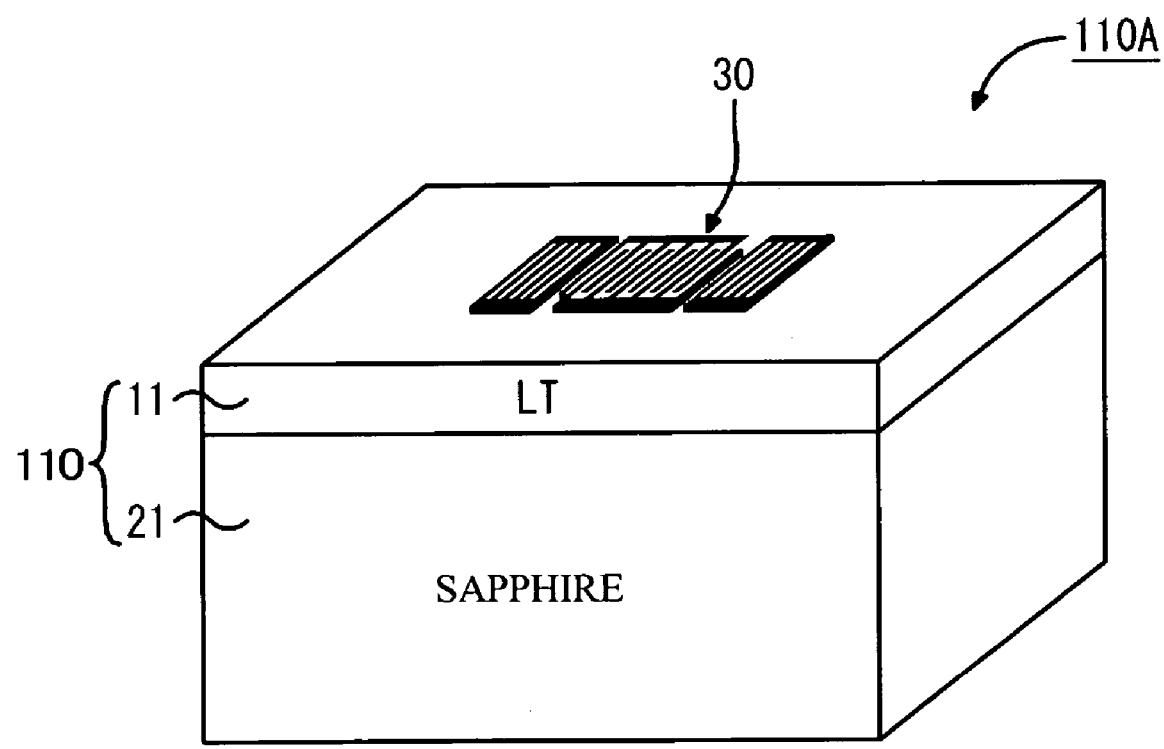
FIG. 3 is a perspective view of a SAW device in accordance with the first embodiment of the present invention.

Referring now to FIG. 3, a SAW device 110A having a 1.9-GHz band SAW resonator 30 will be described. This SAW device 110A has a joined substrate 110 in which a LT substrate 11 is employed as the piezoelectric substrate 10, and a sapphire substrate 21 is employed as the supporting substrate 20. The SAW resonator 30 is formed on the principal plane of the LT substrate 11. In this embodiment, the SAW wavelength is approximately 2.1 μm. The sapphire substrate 21 is easy to process, having a smaller thermal expansion coefficient than the LT substrate 11.

FIG. 3 is a perspective view of the SAW device 110A that has a SAW filter formed on the upper surface of the joined substrate 110. The SAW filter includes comb-like electrodes (IDTs) that form the SAW resonator 30, electrodes pads that serve as electric terminals for external devices, and wiring patterns to connect the IDTs and the electrode pads. The frequency characteristics of the SAW device 110A of FIG. 3 are shown in FIG. 5. For purposes of comparison, the frequency characteristics of a SAW device having the SAW resonator 30 formed on a conventional LT substrate are shown in FIG. 4.

Figure 4:
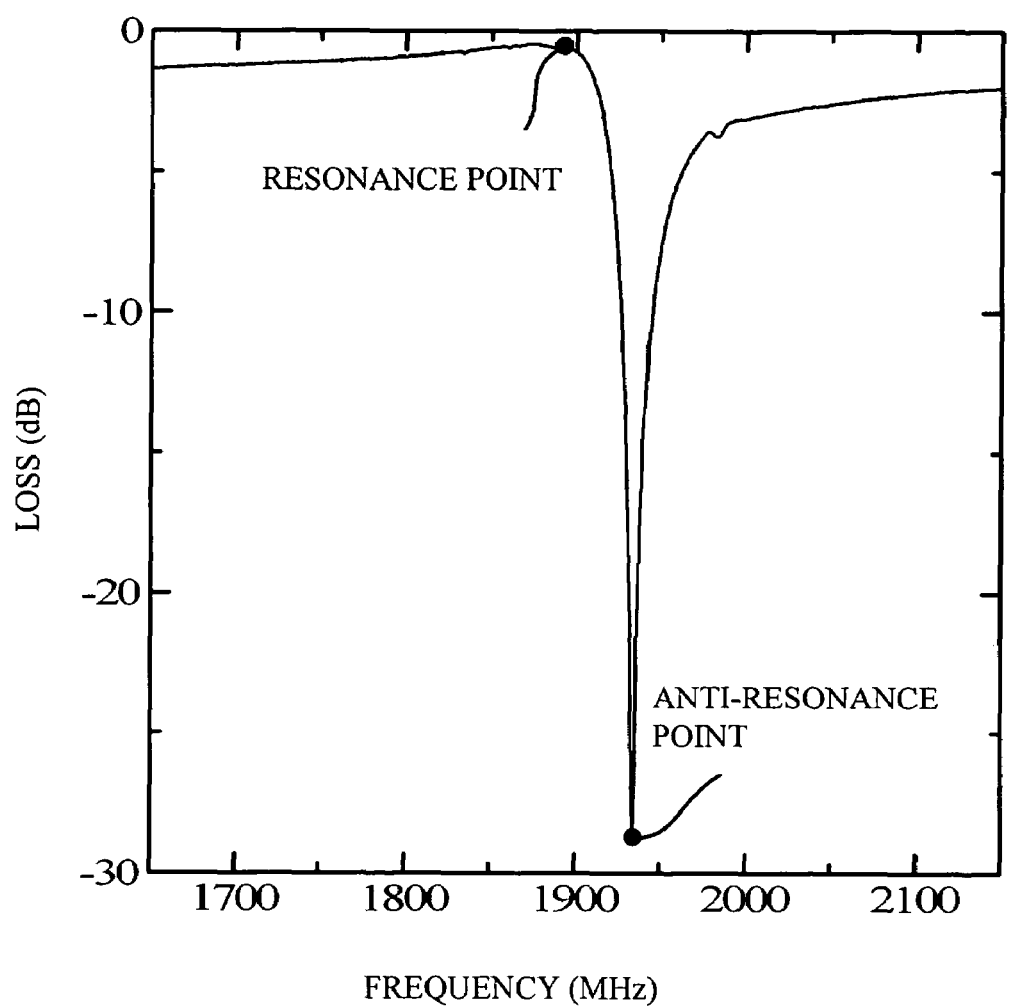
FIG. 4 is a graph showing the frequency characteristics of a conventional SAW device.
Figure 5:
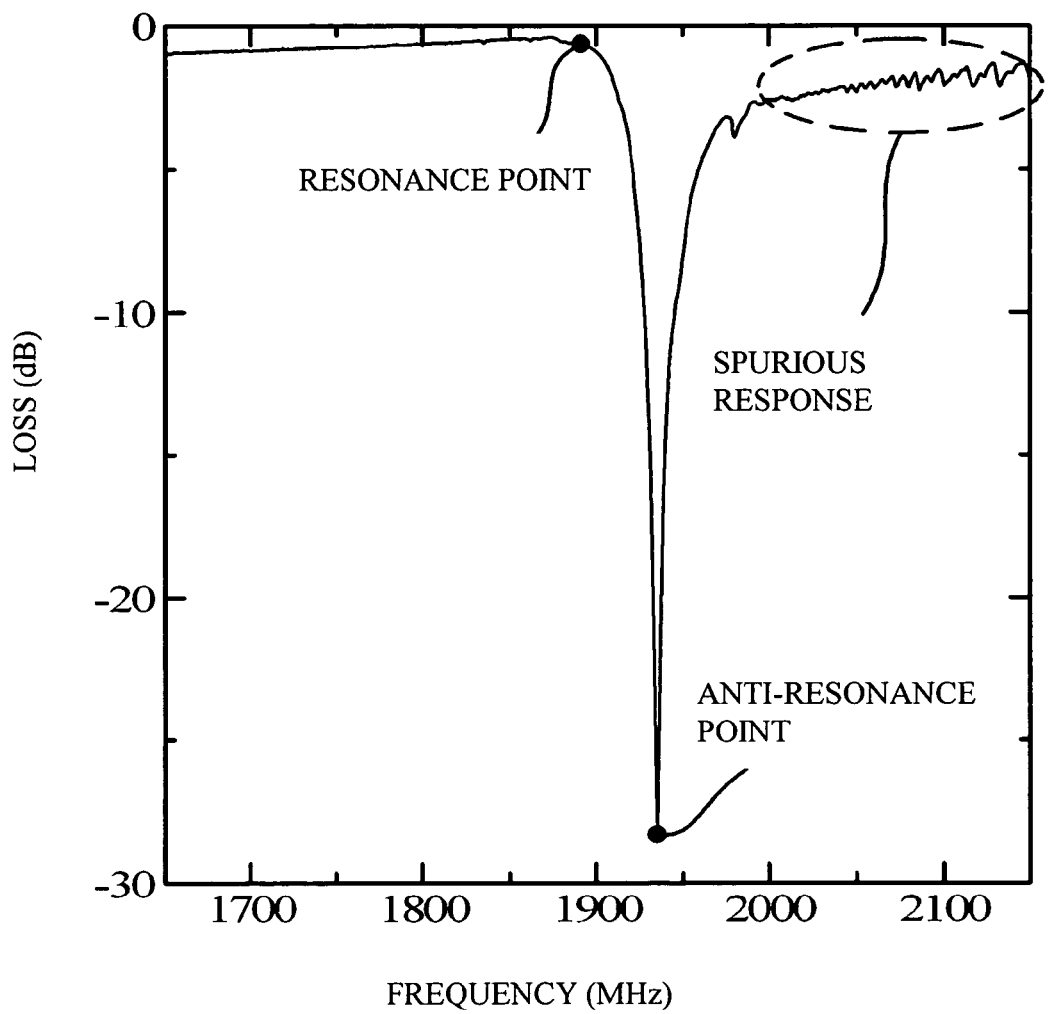
FIG. 5 is a graph showing the frequency characteristics of the SAW device of FIG. 3.

As is apparent from FIGS. 4 and 5, the SAW device 110A in accordance with this embodiment exhibits a spurious response on a higher frequency side of the anti-resonance point due to reflection of bulk acoustic wave (BAW) at the joining interface between the LT substrate 11 and the sapphire substrate 21. On the other hand, the conventional SAW device does not exhibit such a spurious response. Note that the conventional SAW device and the SAW device 110A of this embodiment exhibit the same frequency characteristics in the vicinities of the resonance point and the anti-resonance point.

As for the temperature characteristics, the SAW device 110A of this embodiment exhibits a temperature coefficient of frequency (hereinafter referred to as "TCF") of −20 ppm/° C. at the anti-resonance point, and a TCF of −10 ppm/° C. at the resonance point. The SAW device 110A has greatly improved temperature characteristics, compared with the temperature characteristics of the conventional SAW device having a TCF of −40 ppm/° C. at the anti-resonance point and a TCF of −30 ppm/° C. at the resonance point.

As described above, a piezoelectric substrate and a supporting substrate can be easily joined to each other firmly by virtue of the activation process performed on the joining surface between the relatively easy-to-handle LT and sapphire substrates. Thus, a SAW device that exhibits a large electromechanical coupling coefficient and better temperature coefficients of frequency can be easily manufactured.

Although the LT substrate 11 is employed as the piezoelectric substrate 10 in this embodiment, it is also possible to employ a lithium niobate piezoelectric single-crystal substrate (hereinafter referred to "LN substrate") that is a rotated Y-cut plate and has the SAW propagation direction X.

Second Embodiment

Figure 6:
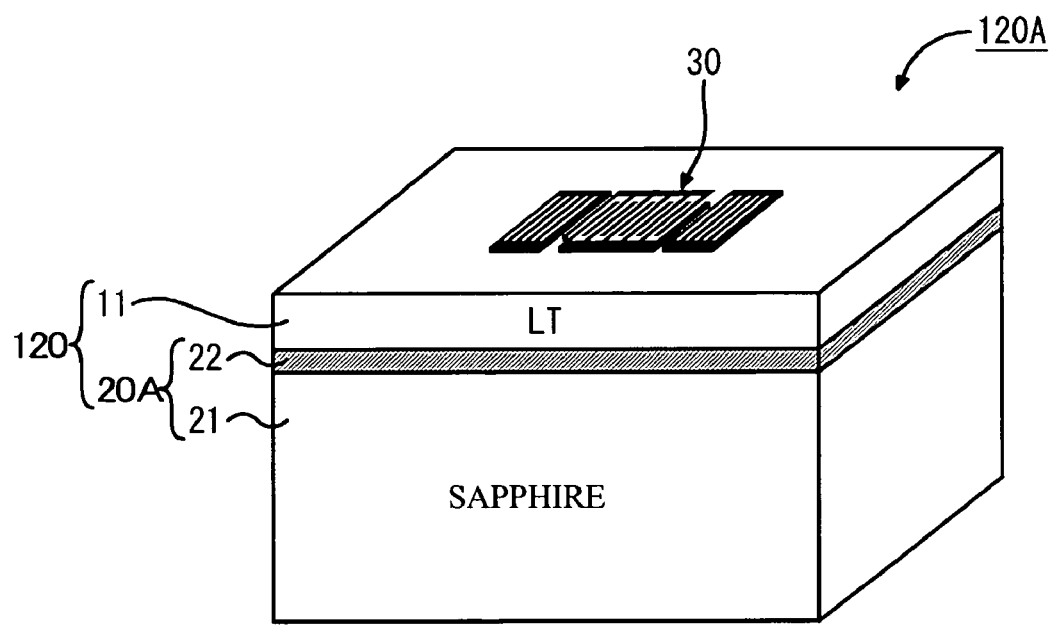
FIG. 6 is a perspective view of a SAW device in accordance with a second embodiment of the present invention.

In the first embodiment, the sapphire substrate 21 is employed as the supporting substrate 20. However, it is also possible to employ a SOS (silicon-on-sapphire) substrate 20A that has an intermediate film (a silicon thin film; see FIG. 6) containing silicon as a main component on the sapphire substrate 21. Referring to FIG. 6, this structure will be described below as a second embodiment of the present invention.

FIG. 6 is a perspective view of a SAW device 120A that includes the SOS substrate 20A in accordance with this embodiment.

As shown in FIG. 6, a joined substrate 120 of this embodiment has a silicon thin film 22 interposed between the sapphire substrate 21 and the LT substrate 11. In the SOS substrate 20A, the thickness of the sapphire substrate 21 is 300 μm, and the thickness of the silicon thin film 22 formed on the sapphire substrate 21 is approximately 1 μm.

The SOS substrate 20A can be formed through epitaxial growth of the silicon thin film 22 on the sapphire substrate 21 in a vacuum, for example. Other than epitaxial growth, a vapor deposition technique or a sputtering technique may be utilized to form the silicon thin film 22. The silicon thin film 22 may be formed also on the LT substrate 11, and the joining process may be performed between two silicon thin films. Alternatively, the silicon thin film 22 may be formed on the sapphire substrate 21 and/or the LT substrate 11 in a vacuum, and the joining process may be performed also in the vacuum.

The joining strength between the substrates 10 and 20 can be further increased by forming the silicon thin film 22 as an intermediate film between the piezoelectric substrate 10 and the supporting substrate 20 and joining the substrates 10 and 20 after surface activation. A surface activation process may be carried out on the substrates 10 and 20 prior to the film formation of an intermediate film. Also, the silicon thin film 22 as an intermediate film may be formed, in a vacuum, on at least one of the joining surfaces of the piezoelectric substrate 10 and the supporting substrate 20, and the substrates 10 and 20 may be jointed in the vacuum. The other aspects and effects of this embodiment are the same as those of the first embodiment, and therefore, explanation of them is omitted herein.

Third Embodiment

In the second embodiment, the SOS substrate 20A having the silicon thin film 22 interposed between the piezoelectric substrate 10 and the supporting substrate 20 increases the joining strength between the two substrates 10 and 20. However, it is also possible to increase the joining strength by forming an intermediate film containing a different material, as a main component, from the materials of the piezoelectric substrate 10 and the supporting substrate 20. The intermediate film should be formed on at least one of the joining surfaces of the piezoelectric substrate 10 and the supporting substrate 20, which are joined after the formation of the intermediate film. This structure will be described below as a third embodiment of the present invention, with reference to the accompanying drawings.

Figure 7:
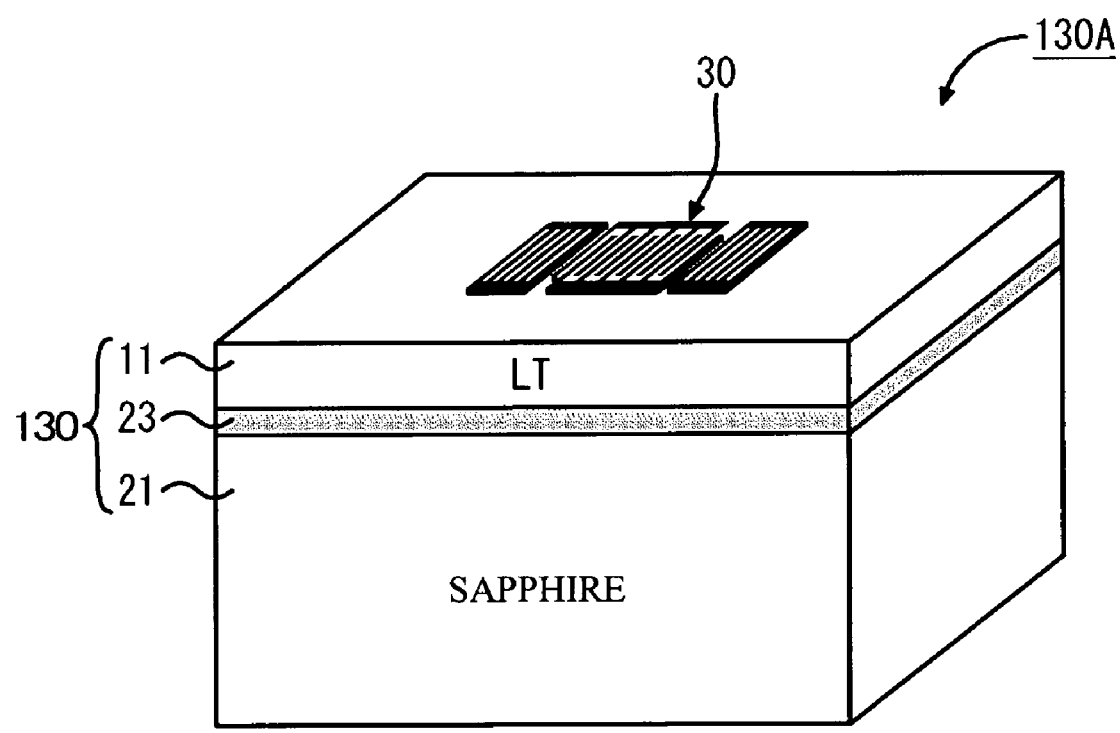
FIG. 7 is a perspective view of a SAW device in accordance with a third embodiment of the present invention.

In a substrate joining process utilizing surface activation, there might be cases where adequate joining strength cannot be obtained by joining some materials directly to each other. In such cases, an intermediate film 23 (shown in FIG. 7) made of a different material from the substrates 10 and 20 should be interposed between the substrate 10 and 20, so as to increase the joining strength. A high joining strength prevents the SAW device 120A from chipping and peeling when the SAW device 120A is cut out as a SAW device chip. Thus, an increased yield can be obtained in the device production. FIG. 7 is a perspective view of a SAW device 130A that employs a LT substrate 11 as the piezoelectric substrate 10 and a sapphire substrate 21 as the supporting substrate 20 in accordance with this embodiment.

In view of the electric characteristics of a SAW device, preferred examples of main components of the intermediate film 23 include insulating materials such as silicon oxide (silicon dioxide, $SiO_2$), silicon nitride ($Si_x$, $N_y$), and aluminum nitride (AlN). However, a conductive material such as a metal may be used for the intermediate film 23. In such a case, the conductive film (the intermediate film 23) should be designed not to short-circuit to a ground formed on the lower surface of the SAW device 130A. Other than Si, the intermediate film 23 may be made of a metal such as gold (Au), copper (Cu), or aluminum (Al). In a case where the material of the joining surfaces is a metal such as Al or Cu, the amorphous layer A3 shown in FIG. 2D may not be formed through the surface activation process in accordance with the present invention.

Figure 8:
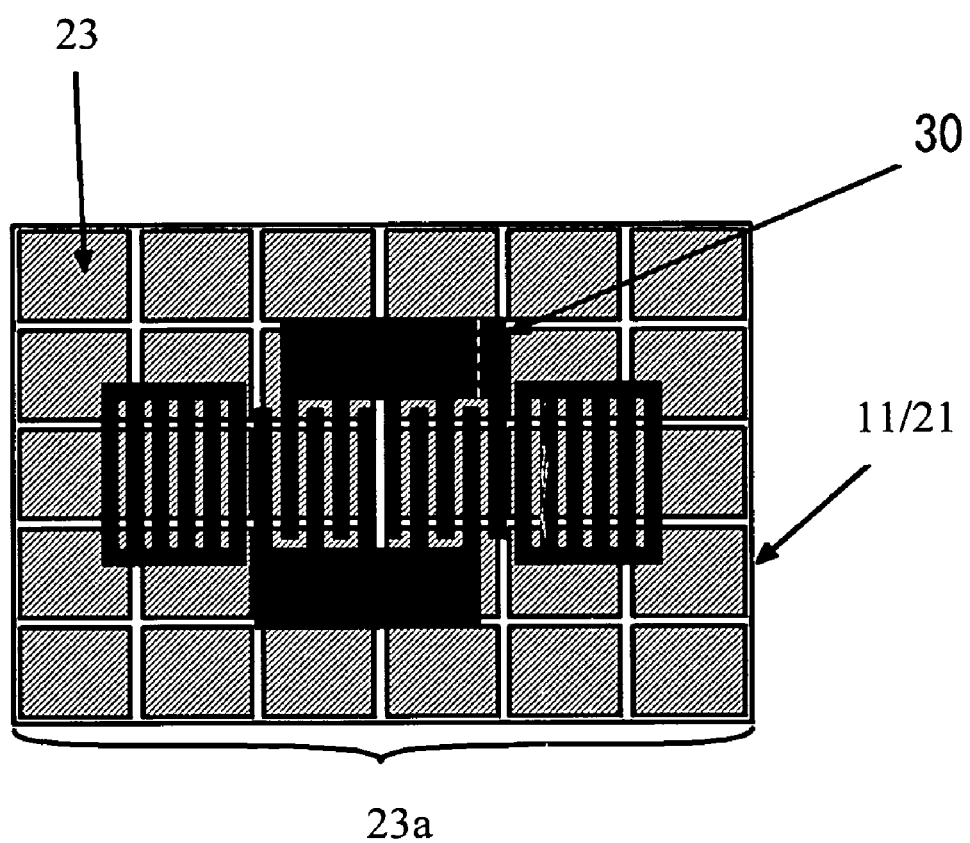
FIG. 8 is a perspective top view of a divided pattern of an intermediate film in accordance with the third embodiment of the present invention.

In a case where a conductive material is employed, the intermediate film 23 at the joining interface should be divided to form a grid-like divided pattern 23a, as shown in FIG. 8. By doing so, the intermediate film 23 becomes electrically independent. Accordingly, the total value of the electrostatic capacitance produced by the conductive pattern including the IDTs, the wiring patterns, and the electrode pads formed on the upper surface of the piezoelectric substrate 11, and the ground pattern formed on the lower surface of the supporting substrate 21, can be reduced. By forming the divided pattern 23a, characteristics degradation of the SAW device 130A can be minimized, despite the existence of a conductive material at the joining interface.

Since the dividing of the intermediate film 23 is performed to obtain electrical separation, the conductive material may be oxidized to form a structure similar to the divided pattern 23a. In a case where the intermediate film 23 is made of Si, for example, the Si is oxidized along the boundary lines of the divided portions of the divided pattern 23a, so that each of the regions divided by silicon oxide ($SiO_2$) can be electrically separated.

Although the grid-like divided pattern 23a shown in FIG. 8 has been described, the dividing fashion is not limited to the grid-like dividing. Also, the size of each divided portion can be arbitrarily decided in view of desired characteristics.

The intermediate film 23 can be formed through epitaxial film growth on the supporting substrate 21 in the same manner as the formation of a SOS substrate. Other than the epitaxial growth technique, a vapor deposition technique or a sputtering technique can be utilized to form the intermediate film 23 on at least one of the substrates. If the joining surfaces are rough, the joining strength decreases. Therefore, it is desirable to maintain the joining surfaces in a mirror-like state when the substrates are to be joined through surface activation. If a material or a film forming technique that leads to rough joining surfaces is employed, the joining surfaces should be polished by a technique such as CMP (chemical mechanical polishing) after the film formation, so as to obtain mirror-like surfaces. In general, a thicker film has a rougher surface. Therefore, the intermediate film 23 should be made as thin as possible by a sputtering technique or the like.

In a specific experiment, a 15 nm thick AlN film was formed as the intermediate film 23 on the sapphire substrate 21 by an ECR (electron cyclotron resonance) sputtering technique. As a result, the joining strength between the LT substrate 11 and the sapphire substrate 21 was increased. Accordingly, chipping was reduced at the time of dicing, and an increased yield was obtained in the SAW device production.

As described above, the joining strength between the substrates 10 and 20 can be increased by interposing the intermediate film 23 between the piezoelectric substrate 10 and the supporting substrate 20, which are joined after a surface activation process. The intermediate film 23 is made of a different material from both of the substrates 10 and 20. The other aspects and effects of this embodiment are the same as those of the first embodiment, and therefore, explanation of them is omitted herein.

Fourth Embodiment

Figure 9:
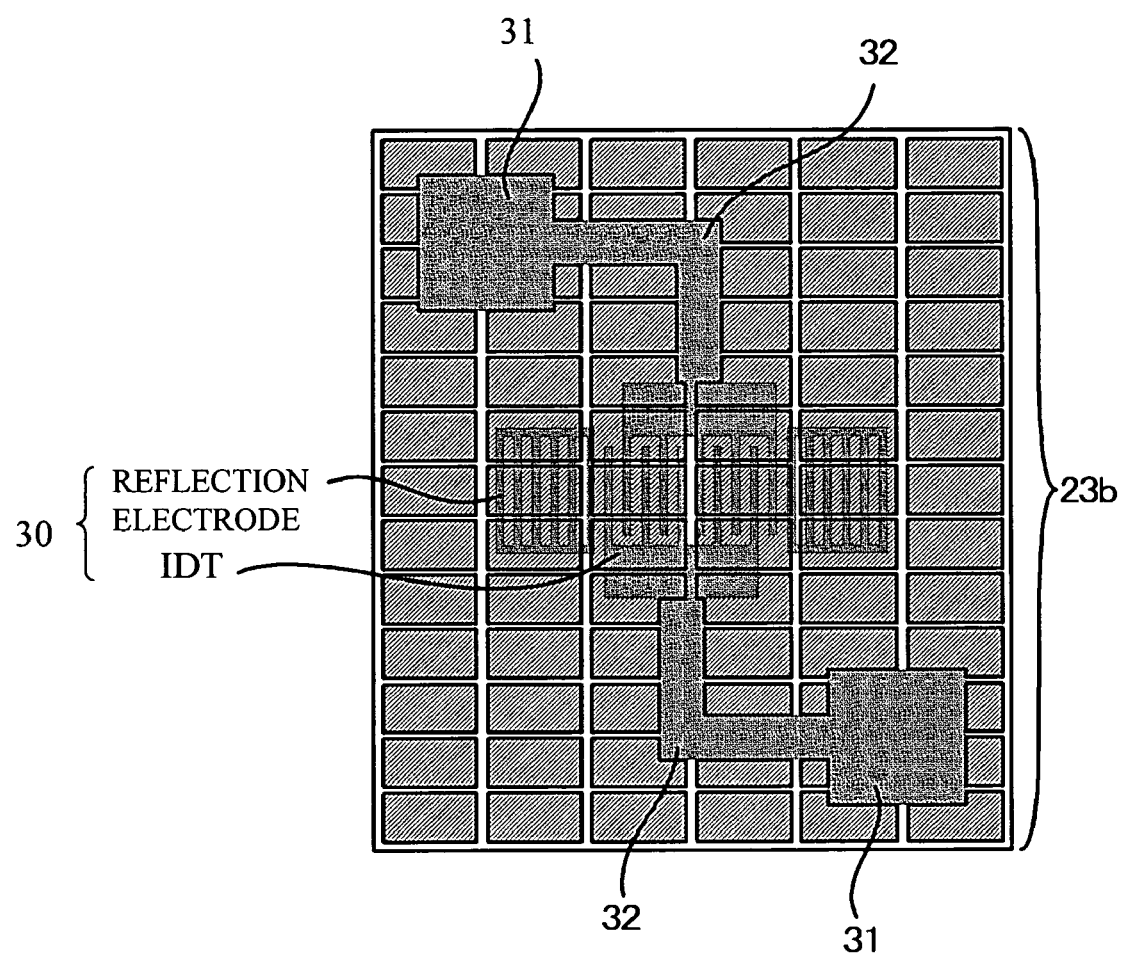
FIG. 9 illustrates the structure of a divided pattern of an intermediate layer in accordance with a fourth embodiment of the present invention.

The intermediate film 23 of the third embodiment may be designed so as not to bridge the input/output electrode pads for the SAW resonator 30 and the wiring patterns connected to the electrode pads formed immediately above the intermediate film 23. With this structure, electric energy leakage through the conductive film located at the joining interface can be prevented. To achieve such an effect, part of the intermediate film 23 located in at least the area of the input/output electrode pads should be divided into portions of such a size as not to bridge the input/output electrode pads, or should be arranged so as not to bridge the input/output electrode pads. Alternatively, the divided pattern 23a of the intermediate film 23 and the IDT pattern of the SAW resonator 30 are aligned, so that the intermediate film 23 can be prevented from bridging the input/output electrode pads and the wiring patterns. In that case, part of the intermediate film 23 in the area without the input/output electrode pads does not have to be divided into small portions. A divided pattern 23b of the intermediate film 23 formed in this manner is shown in FIG. 9.

Further, the intermediate film 23 is divided into smaller portions than the aperture size (the lengths of the crossing electrode fingers) of the IDTs, so that the electric energy loss via the intermediate film 23 can be reduced. This also applies to the silicon thin film 22 of the second embodiment.

Fifth Embodiment

In a case where the piezoelectric substrate 10 of any of the foregoing embodiments is formed with a LT substrate, a LN substrate, or the like, the temperature characteristics of the SAW device can be improved by thinning the piezoelectric substrate 10 through a grinding and polishing process after the substrate joining process. If fluoronitric acid is employed to prevent polishing distortion during the polishing process, the intermediate film 23 of the third or fourth embodiment should preferably be made of Si, carbon (C), Au, or the like, which is resistant to fluoronitric acid.

Sixth Embodiment

Figure 10:
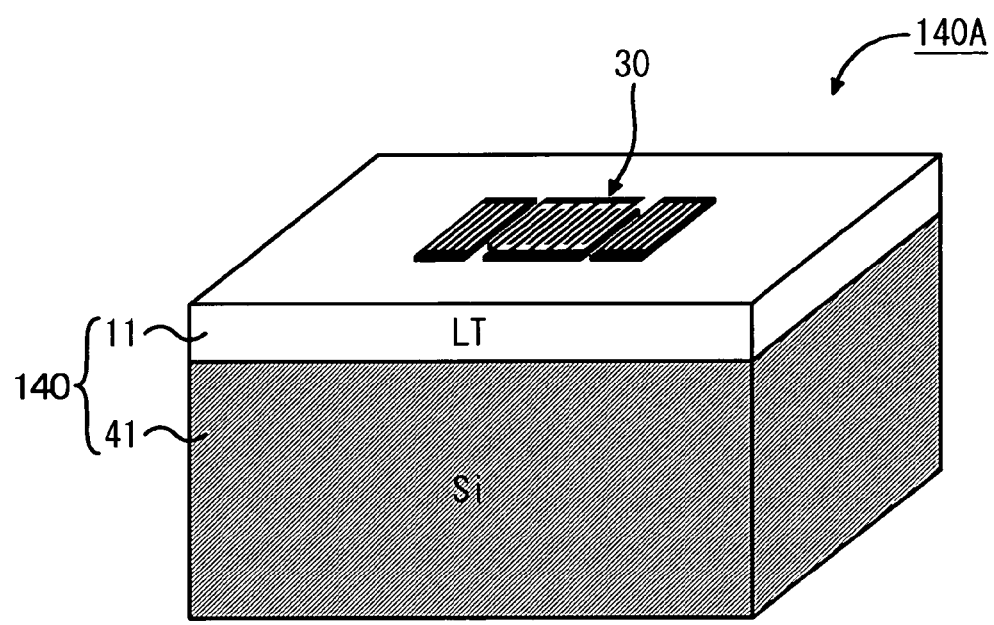
FIG. 10 is a perspective view of a SAW device in accordance with a sixth embodiment of the present invention.

Referring now to FIG. 10, a sixth embodiment of the present invention will be described in detail. FIG. 10 is a perspective view of a SAW device 140A in accordance with this embodiment.

Like the SAW device 110A of the first embodiment, the SAW device 140A shown in FIG. 10 includes a Y-cut X-propagation LT (having a linear expansion coefficient in the SAW propagation direction X is 16.1 ppm/° C.) substrate (a LT substrate 11) as the piezoelectric substrate 10. A 1.9-GHz band SAW resonator 30 is formed on the LT substrate 11. In this embodiment, the SAW wavelength is approximately 2.1 µm.

As for the supporting substrate 20, a (100)-plane Si substrate having a linear expansion coefficient of 3.3 ppm/° C. in the SAW propagation direction X is employed. This substrate will be hereinafter referred to as the silicon substrate 41.

The LT substrate is 25 µm thick, and the silicon substrate 41 is 300 µm thick. As for the temperature characteristics of the SAW device 140A, a TCF of −17 ppm/° C. is obtained at the anti-resonance point, and a TCF of −8 ppm/° C. is obtained at the resonance point.

The use of silicon has the advantage that silicon has a smaller linear expansion coefficient than sapphire. The other aspects of this embodiment are the same as those of the first embodiment, and therefore, explanation of them is omitted herein.

When used in a duplexer or the like that is a device for separating transmitted signals and received signals in a portable telephone, the power durability of the SAW device becomes important. In this embodiment, the silicon substrate 41 having a heat conductivity almost 30 times as high as that of LT (the heat conductivity of silicon being 168 W/mK, while the heat conductivity of LT being 5 W/mK or lower) is used as the supporting substrate 20, and accordingly, heat generated by the IDTs can easily escape via the silicon substrate 41. Thus, a higher power durability than the power durability of a conventional SAW device with a LT substrate can be achieved. In an experiment to prove this, a SAW duplexer having a transmit SAW filter and a receive SAW filter was produced by forming at least two 1.9-GHz band SAW resonators 30 on a joined substrate 140 formed by joining the LT substrate 11 and the silicon substrate 41. As a result, the obtained power durability was higher than the power durability of a SAW duplexer with a conventional substrate.

Figure 11:
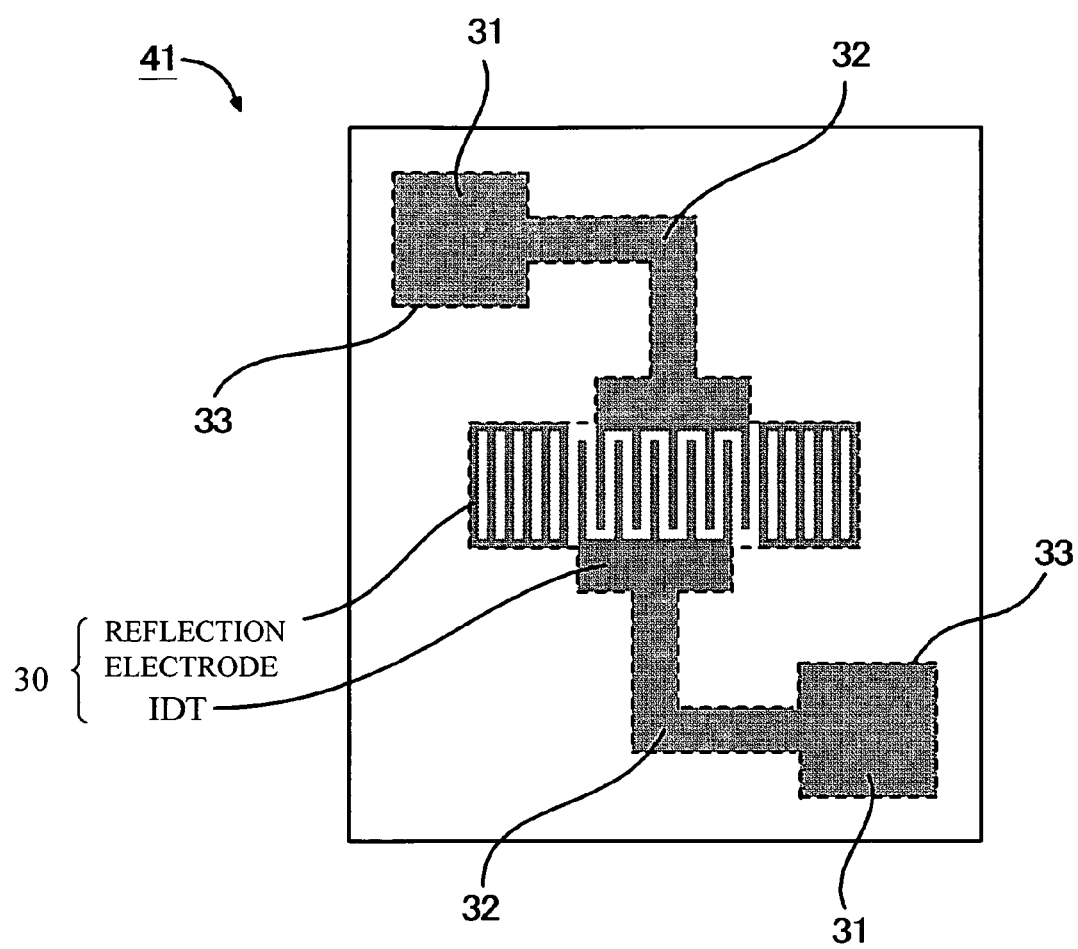
FIG. 11 illustrates a high-resistance region formed on a supporting substrate in accordance with the sixth embodiment of the present invention.

If a substrate having a resistivity lower than 100 Ω·cm is employed as the supporting substrate 20, the electric energy flowing from the electrodes pads and the wiring patterns of the SAW resonator 30 to the ground via the supporting substrate 20 increases, and the loss in the SAW device increases accordingly. To avoid such a problem, the silicon substrate 41 should preferably have a resistivity of 100 Ω·cm or higher, for example, 1000 Ω·cm. The silicon substrate 41 having a relatively high resistivity can be formed by reducing the impurity concentration. Regions having a relatively high resistivity of, for example, 100 Ω·cm or higher should be formed only immediately below the current flowing areas such as the SAW resonator 30, the electrode pads 31, and the wiring patterns 32. Those regions are shown as high resistance regions 33 in FIG. 11.

Seventh Embodiment

Figure 12:
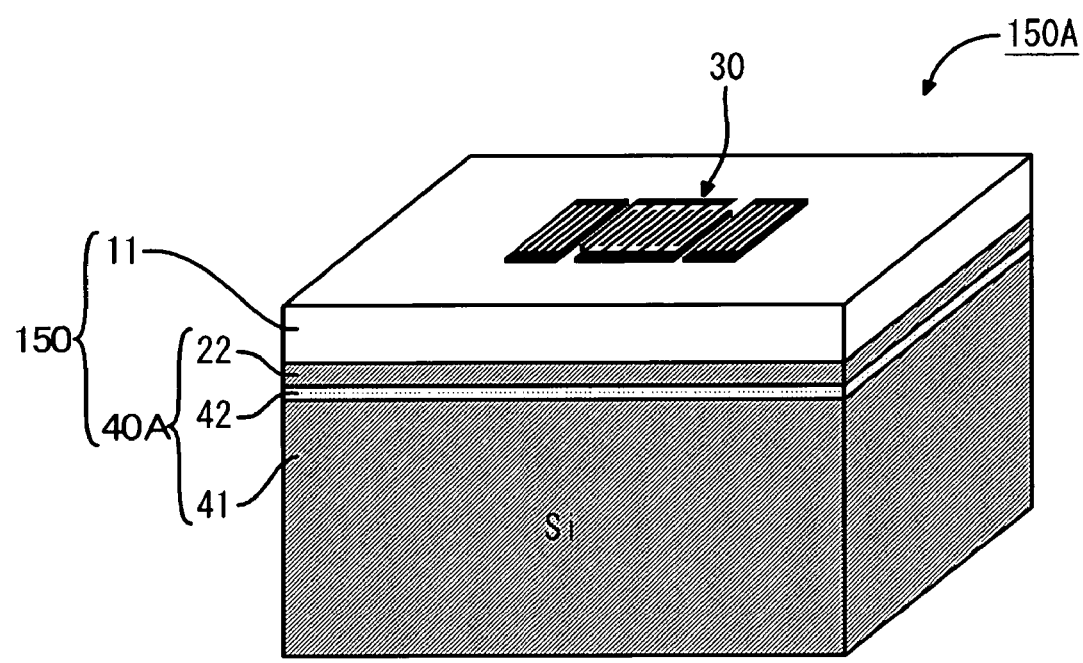
FIG. 12 is a perspective view of a SAW device in accordance with a seventh embodiment of the present invention.

Instead of the silicon substrate 41, it is possible to employ a SOI (silicon-on-insulator) substrate 40A having a silicon thin film 22 on an insulating film 42, as shown in FIG. 12. This structure will be described below as a seventh embodiment of the present invention.

FIG. 12 is a perspective view of a SAW device 150A that includes the SOI substrate 40A in accordance with this embodiment.

As shown in FIG. 12, a joined substrate 150 of this embodiment has a laminated body of the insulating film 42 and the silicon thin film 22 interposed between a silicon substrate 41 and a LT substrate 11. In this SOI substrate 40A, the silicon substrate 41 is 300 µm thick, the insulating film 42 formed on the silicon substrate 41 is 1 µm thick, and the silicon thin film 22 formed on the insulating film 42 is 2 µm thick.

As described above, the SOI substrate 40A employed as the supporting substrate 20 improves the temperature characteristics of the SAW resonator 30, as in the sixth embodiment. Also, as the insulating film 42 exists between the ground formed on the lower surface of the joined substrate 150 and the IDTs, the input/output electrodes pads, and the wiring patterns formed on the upper surface of the joined substrate 150, electric energy flowing to the ground via the supporting substrate 20 can be minimized. Thus, a SAW device with a smaller loss can be obtained. Furthermore, the use of silicon has the advantage that silicon has a smaller linear expansion coefficient than sapphire. The other aspects of this embodiment are the same as those of the first embodiment, and therefore, explanation of them is omitted herein.

In the above structure, however, electric energy leakage occurs between the input/output electrodes pads or the like, because the silicon thin film 22, which is conductive, exists between the LT substrate 11 and the insulating film 42. Such a problem can be solved by dividing the silicon thin film 22 to form electrically divided pattern 23a shown in FIG. 8.

Eighth Embodiment

Figure 13:
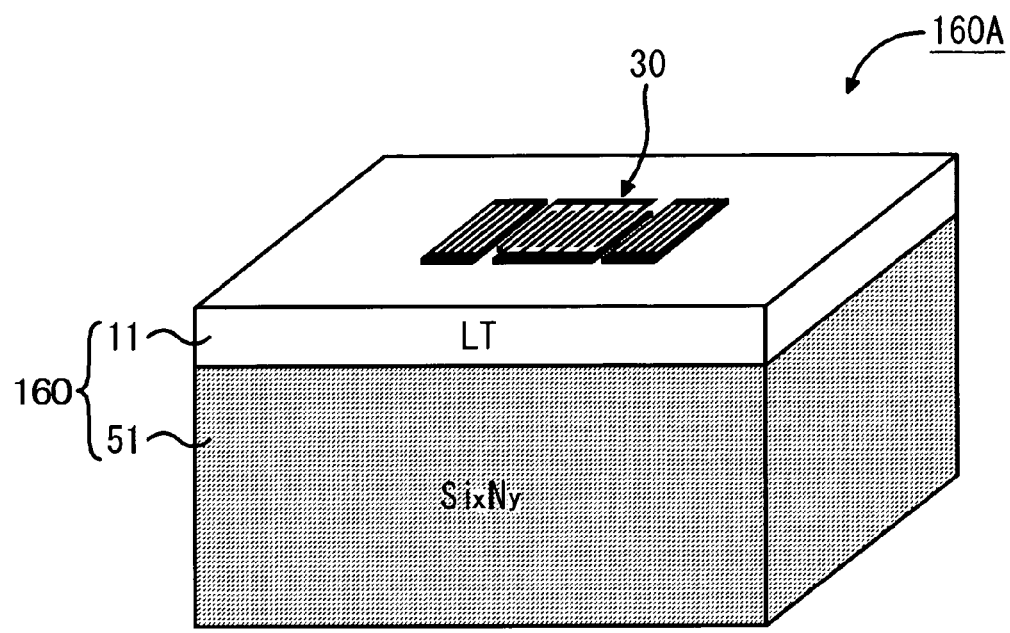
FIG. 13 is a perspective view of a SAW device in accordance with an eighth embodiment of the present invention.

Referring now to FIG. 13, an eighth embodiment of the present invention will be described in detail. FIG. 13 is a perspective view of a SAW device 160A in accordance with this embodiment.

Like the SAW device 110A of the first embodiment, the SAW device 160A shown in FIG. 13 includes a Y-cut X-propagation LT (having a linear expansion coefficient of 16.1 ppm/° C. in the SAW propagation direction X) substrate (a LT substrate 11) as the piezoelectric substrate 10. A 1.9-GHz band SAW resonator 30 is formed on the LT substrate 11. In this embodiment, the SAW wavelength is 2.1 μm.

As for the supporting substrate 20, silicon nitride ($Si_xN_y$) having a linear expansion coefficient of 2.6 ppm/° C. in the SAW propagation direction X is employed. This substrate will be hereinafter referred to as the silicon nitride substrate 51. The silicon nitride substrate 51 has a smaller thermal expansion coefficient than the LT substrate 11, and is easy to process.

The LT substrate 11 is 30 μm thick, while the silicon nitride substrate 51 is 300 μm thick. As for the temperature characteristics of the SAW device 160A having the above structure, a TCF of −23 ppm/° C. is obtained at the anti-resonance point, and a TCF of −12 ppm/° C. is obtained at the resonance point.

As described above, the supporting substrate 20 formed by the silicon nitride substrate 51 having a smaller linear expansion coefficient than the sapphire substrate 21, for example, can improve the temperature coefficients of frequency. The other aspects of this embodiment are the same as those of the first embodiment, and therefore, explanation of them is omitted herein. Although the silicon nitride substrate 51 is employed as the supporting substrate 20 in the above description, it is also possible to employ a ceramic substrate made of aluminum oxide (alumina), aluminum nitride, or the like. Such a ceramic substrate has a smaller thermal expansion coefficient than the LT substrate 11, and is easy to process.

Other Embodiments

The foregoing embodiments are only a few examples of preferred embodiments of the present invention, and various modifications and changes may be made to these embodiments without departing from the scope of the invention. The numerical values indicating sizes and parameters, and the materials mentioned in the above descriptions are merely examples, and can be arbitrarily changed. Further, there may be two or more SAW resonators 30 formed on the piezoelectric substrate 10. Accordingly, the present invention can be applied to a ladder filter or a double-mode filter that includes two or more SAW resonators 30, and also to a duplexer that includes a ladder filter or a double-mode filter.

Figure 14:
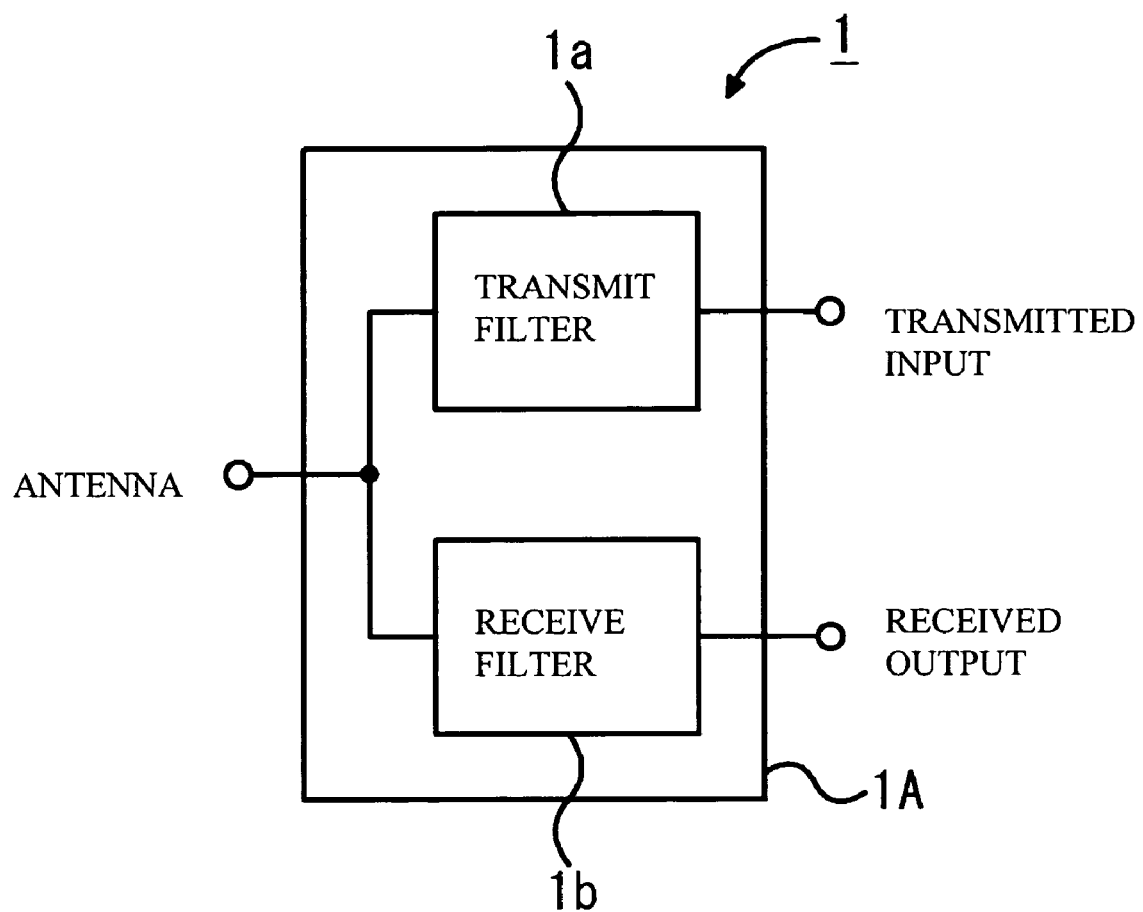
FIG. 14 is a block diagram illustrating the structure of a duplexer including a SAW device in accordance with the present invention.

In the joined substrate, the effect of restricting expansion and contraction of the piezoelectric substrate due to thermal stress is larger at a longer distance from the chip end. This effect can be maximized by increasing the chip area with a number of SAW devices arranged on one chip. For example, a transmit SAW filter (a transmit filter 1a) and a receive SAW filter (a receive filter 1b) may be arranged on a single chip 1A in a duplexer 1, as shown in FIG. 14.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of manufacturing a surface acoustic wave device that has a surface acoustic wave filter including comb-shaped electrodes, electrode pads, and wiring patterns formed on a joined substrate produced by joining a piezoelectric substrate and a supporting substrate to each other, the method comprising the steps of:

activating at least one of the joining surfaces of the piezoelectric substrate and the supporting substrate; and joining the piezoelectric substrate and the supporting substrate in such a manner that the activated joining surfaces face each other, wherein:

the activating step includes the step of carrying out an activation process using one of ion beams, neutralized high-energy atom beams, or plasma of inert gas, or oxygen, on at least one of the joining surfaces of the piezoelectric substrate and the supporting substrate;

the joining step includes the step of directly joining the piezoelectric substrate and the supporting substrate at room temperature;

the piezoelectric substrate is a lithium tantalite, or a lithium niobate piezoelectric single-crystal substrate, that is a rotated Y-cut plate having a surface acoustic wave propagation direction X; and the supporting substrate is a single-crystal substrate containing sapphire as a main component, or a ceramic substrate containing aluminum oxide, aluminum nitride or silicon nitride as a main component.

2. The method as claimed in claim 1, wherein the step of joining the piezoelectric substrate and the supporting substrate is carried out in a vacuum, or an atmosphere of a high purity gas.

3. A method of manufacturing a surface acoustic wave device that has a surface acoustic wave filter including comb-shaped electrodes, electrode pads, and wiring patterns formed on a joined substrate produced by joining a piezoelectric substrate and a supporting substrate to each other, the method comprising the steps of:

activating at least one of the joining surfaces of the piezoelectric substrate and the supporting substrate; and joining the piezoelectric substrate and the supporting substrate in such a manner that the activated joining surfaces face each other, wherein:

the joining step includes the step of directly joining the piezoelectric substrate and the supporting substrate at room temperature;

the piezoelectric substrate is a lithium tantalite, or lithium niobate piezoelectric single-crystal substrate, that is a rotated Y-cut plate having a surface acoustic wave propagation direction X; and the supporting substrate is a single-crystal substrate containing sapphire as a main component.

* * * * *